United States Patent [19]

Nguyen et al.

[11] Patent Number: 4,729,816

[45] Date of Patent: Mar. 8, 1988

[54] ISOLATION FORMATION PROCESS WITH ACTIVE AREA PROTECTION

[75] Inventors: Bich Y. Nguyen; Howard K. H. Leung, both of Austin, Tex.; Bridgette A. Bergami, Gilbert, Ariz.

[73] Assignee: Motorola, Inc., Schaumburg, Ill.

[21] Appl. No.: 271

[22] Filed: Jan. 2, 1987

[51] Int. Cl.$^4$ .............. B44C 1/22; C03C 15/00; C03C 25/06

[52] U.S. Cl. .................... 148/33.3; 156/653; 156/657; 156/659.1; 156/661.1; 156/648; 437/226; 437/227

[58] Field of Search ............ 29/571, 576 W; 156/648, 156/653, 657, 659.1, 661.1, 662; 427/93, 94; 357/47, 49, 54

[56] References Cited

U.S. PATENT DOCUMENTS

| | | | |
|---|---|---|---|
| 3,783,047 | 1/1974 | Paffen et al. | 148/187 |
| 4,111,724 | 9/1978 | Ogiue et al. | 148/175 |
| 4,398,992 | 8/1983 | Fang et al. | 156/643 |
| 4,533,429 | 8/1985 | Josquin | 156/643 |
| 4,551,910 | 11/1985 | Patterson | 29/576 |
| 4,577,394 | 3/1986 | Peel | 29/576 W |
| 4,583,281 | 8/1986 | Ghezzo et al. | 29/576 W |
| 4,650,544 | 3/1987 | Erb et al. | 156/653 |
| 4,670,090 | 6/1987 | Sheng et al. | 156/653 |

OTHER PUBLICATIONS

J. Hui, et al. "Selective Oxidation Technologies for High Density MOS," *IEEE Electron Device Letters*, vol. EDL-2, No. 10, Oct. 1981, pp. 244-247.

J. Hui, et al. "Electrical Properties of MOS Devices made with SILO Technology," *Proceedings of IEDM*, 1982, pp. 220-223.

*Primary Examiner*—William A. Powell
*Attorney, Agent, or Firm*—John A. Fisher; Jeffrey Van Myers; David L. Mossman

[57] ABSTRACT

An isolation formation process that minimizes bird's beak encroachment and preserves gate oxide integrity in the active region. Future active areas are protected by a structure having a central protective material layer, such as a thermal oxide, surrounded by a ring of thermal nitride. The thermal nitride and central protective material are coated by active region protection masking covers. In one embodiment, the masking covers include sidewalls over the thermal nitride ring. In another embodiment, the central protective material layer is overetched beneath an undercut covering layer to provide an undercut filled by the sidewall. All of these features contribute to bird's beak encroachment prevention which may be narrowed to as little as 0.07 microns per side.

15 Claims, 14 Drawing Figures

—COMPARATIVE—

ISOLATION FORMATION PROCESS WITH ACTIVE AREA PROTECTION

FIELD OF THE INVENTION

The invention relates to methods of forming isolation regions on semiconductor substrates prior to device fabrication and more particularly relates to maximizing and protecting the active areas where devices are to be formed during the isolation region formation.

BACKGROUND OF THE INVENTION

In the fabrication of integrated circuits, particularly metal-oxide-semiconductor (MOS) integrated circuits, one of the initial processing steps concerns the formation of thick field isolation regions at predetermined sites on the semiconductor substrate. Usually, the substrate is mono-crystalline silicon and the isolation regions are silicon dioxide. These thick field oxide regions are used primarily for isolation, that is, to prevent parasitic conduction which would otherwise occur when conductive lines cross these regions between active devices.

Many of the common processes for forming these field oxide regions uses a silicon nitride layer over the future active areas, i.e. the regions where devices will be built. Openings are formed in this layer at the predetermined sites where the isolating material, usually silicon dioxide is then grown on the substrate. The oxide grows primarily at the openings and not at the regions protected by the silicon nitride layer. However, as the oxide grows vertically, it encroaches horizontally and lifts the edges of the silicon nitride layer at the edges. In these areas of lifted silicon nitride, the field oxide becomes thinner, and is generally tapered. These tapered regions, which occur at the nitride-substrate interface, are sometimes called "bird's beaks" since their cross section resembles a bird's beak.

The bird's beak oxide regions consume valuable substrate area without providing benefits. For example, in the beak region of the oxide, the oxide is generally too thin to provide good field isolation and yet too thick to be used as part of active devices. A number of schemes have been proposed to reduce the bird's beak area to reclaim the silicon substrate area and increase the device density of the resulting integrated circuit chip, which is always a major concern.

For example, U.S. Pat. No. 4,111,724 shows a patterned double layer of silicon nitride over silicon oxide used as a mask for growth of isolation regions. In U.S. Pat. No. 3,783,047, a scheme is disclosed whereby a layer of oxide covered by a layer of nitride was patterned so as to over etch the oxide and thereby undercut the nitride, and thus was used as a mask to grow the field oxide.

Special treatment to the edges of the masking pattern is the subject of a number of patents. U.S. Pat. No. 4,398,992 describes a complex "Defect Free Zero Oxide Encroachment Process" using L-shaped structures of stress-relief oxide covered by nitride at the edges of the pattern to reduce bird's beak encroachment. Beveled walls of nitride-covered oxide at the edges of the field oxidation mask are shown in U.S. Pat. No. 4,533,429. And in U.S. Pat. No. 4,577,394, a mask of patterned nitride over oxide is covered by a thick layer of phosphosilicate glass (PSG) which has sloped edges that protrude beyond the edges of the nitride mask.

The well known sealed interface local oxidation (SILO) process where a patterned triple layer of two nitride layers with an oxide layer sandwiched therebetween is described by J. Hui, et al. in "Electrical Properties of MOS Devices Made with SILO Technology", *Proceedings of IEDM*, 1982, pp. 220–223. Thermally grown nitride or "thermal nitride" is popular in SILO-type isolation techniques because it has been found to permit less bird's beak encroachment than nitride formed in other ways, such as by low pressure chemical vapor deposition (LPCVD). See, for example, J. Hui, et al. "Selective Oxidation Technologies for High Density MOS," *IEEE Electron Device Letters*, Vol. EDL-2, No. 10, October 1981, pp. 244–247 and U.S. Pat. No. 4,551,910.

Another issue that has come to light recently is that nitride layers, thermally grown or otherwise, which are used as masks in future active areas where devices are to be formed, tend to damage the surface and adversely affect the performance of devices formed there after the nitride is stripped off, particularly the gate oxide integrity of MOS transistors. Defect-free surfaces in the active regions are particularly important in very large scale integration (VLSI) integrated circuits. One possible solution to this problem may be seen in U.S. Pat. No. 4,583,281 wherein silicon oxide is used to cover the center of the future active regions and LPCVD silicon nitride is present at the edge of the mask for the field oxide growth in the form of a sidewall spacer.

SUMMARY OF THE INVENTION

Accordingly, it is an object of the present invention to provide a field oxide isolation scheme that is compatible with the needs of VLSI circuits.

Another object of the invention is to provide a field oxidation isolation process that will minimize bird's beak encroachment that undesirably uses substrate area.

It is another object of the present invention to provide a field oxidation isolation method that protects the future active regions of the substrate.

Still another object of the invention is to provide a field oxidation isolation process that can provide embodiments which can define submicron features using either current optical lithography systems with their present micron-scale resolution limitations or electron beam and X-ray lithographic systems which can resolve submicron features on their own.

In carrying out these and other objects of the invention, there is provided, in one form, a protected active region formed on a surface of a semiconductor substrate, for future device formation, surrounded by an isolation region, which is made by the process involving first forming a protective material over the protected region of the surface of the semiconductor substrate. Next, thermal silicon nitride rings are formed in the semiconductor substrate immediately surrounding the protected region and a masking cover is created over the protected region and the surrounding silicon nitride ring. Subsequently, an isolation region is formed in the semiconductor substrate surrounding the ring, and finally the masking cover, the ring and the protective material are removed to expose the protected region.

Optionally, the active region protection masking covers may involve multiple layers, sidewall spacers or sidewall spacers with an L-shaped profile.

It should be noted that the vertical features in the FIGS. are not to scale and exaggerated relative to the horizontal features for clarity.

DETAILED DESCRIPTION OF THE INVENTION

A new method and structure for limiting the extension of the bird's beak structure of field oxide isolation regions while minimizing the defects in the active region normally caused by thermal nitride thereon will be described with reference to some of the particular embodiments of the process. Of course, it will be appreciated that one skilled in the art may make modifications to the process which are not described herein which may nevertheless fall within the scope of the claims herein. For example, one particular material may be substituted for another as long as its properties are compatible with the process and structure described.

Figure 1:
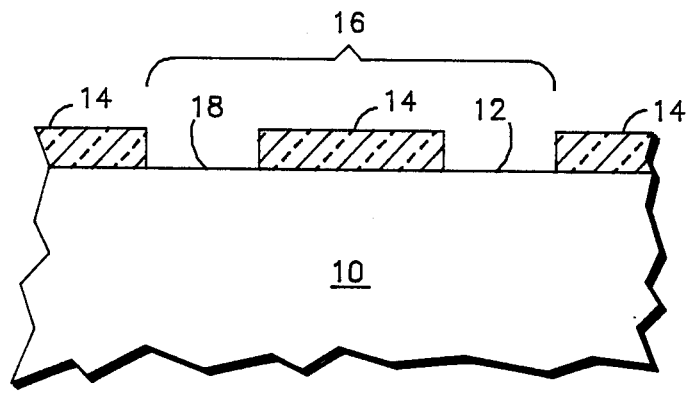
FIGS. 1 through 6 are cross sectional illustrations of the formation of an integrated circuit made in accordance with one embodiment of the isolation process of the present invention.
Figure 2:
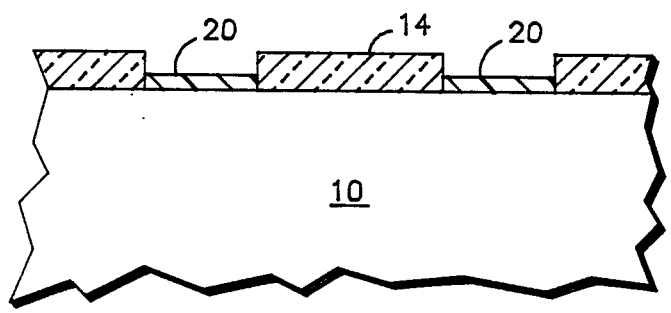

Shown in FIGS. 1 through 6 are steps of one of the embodiments of the isolation process of the present invention. FIG. 1 illustrates a semiconductor substrate 10 with a surface 12 having a pattern of protective material 14 thereon. The protective material 14 must be one that will not damage the silicon surface to the extent that the gate oxide integrity of subsequently formed devices suffers. As examples only, the protective material pattern 14 may be thermally grown or chemical vapor deposited (CVD) silicon dioxide and may be from 500 to 1000 angstroms thick. Typically, pattern 14 is formed by creating a uniformly thick layer over surface 12 which is then patterned by etching in the customary manner. The active region in which devices will be grown after the formation of the integrated circuit devices is designated 16, while the portions of the substrate surface 12 not covered by the pattern 14 are exposed portions 18 into which thermal silicon nitride ($Si_3N_4$) 20 is selectively formed, as shown in FIG. 2. By selective formation it is meant that the nitride grown by the known methods is formed only in the exposed portions of silicon whereas none is formed on top of the protective material pattern 14. This is a well known property of thermal nitride. The selective thermal nitride may be from about 35 to 50 angstroms thick, although it could be thinner. From one point of view, the thermal silicon nitride 20 forms rings around the protective material regions 14, particularly after a patterned etch step, subsequently described.

Next, active region protection masking covers 22 are formed over selected protective material regions 14 and rings of thermal silicon nitride 20, which here are coextensive with the future active region 16. The active region protection masking covers 22 may be any suitable material such as silicon dioxide or silicon nitride or any combination thereof, for example, and the total cover 22 thickness may be from about 500 to 1000 angstroms thick although other thicknesses may be used. In the particular example illustrated in FIG. 3, the layer is a blanket layer of CVD nitride 26. In another embodiment of the process, a combination of a CVD nitride layer 26 and a CVD oxide layer might be used.

Figure 3:
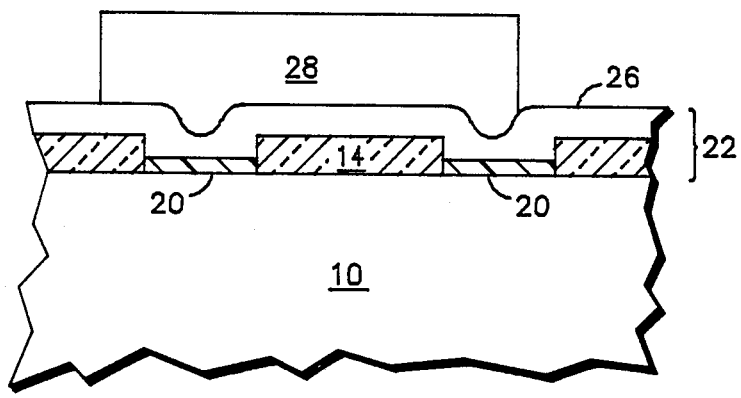
Figure 4:
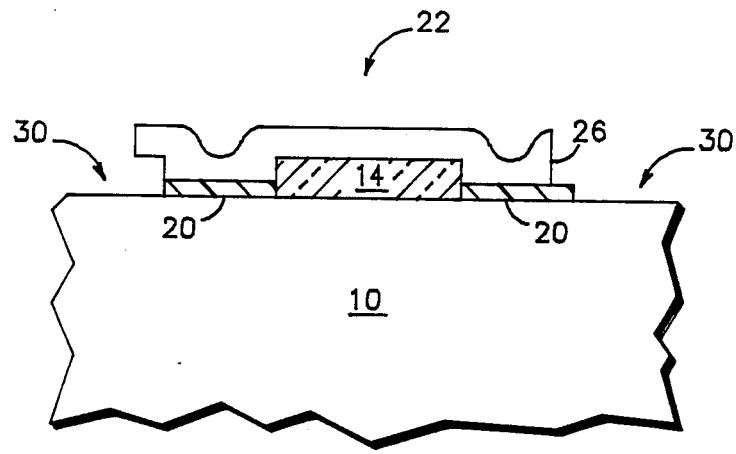
Figure 5:
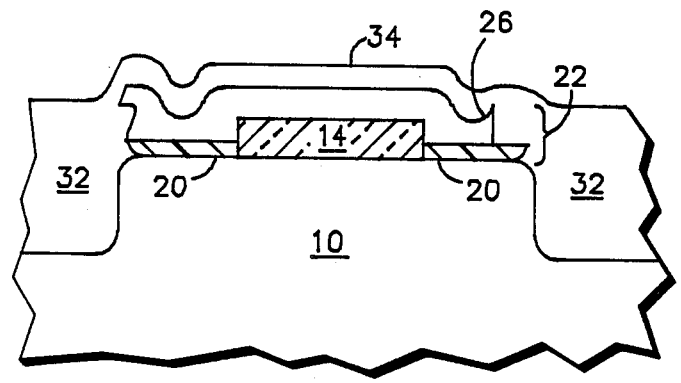

Further as shown in FIGS. 3 and 4, the active region protective masking cover 22 would be patterned, for example by the well known means of providing a photoresist pattern 28 thereover and etching to form a pattern of the active region masking cover 22 as shown in FIG. 4. In the example shown, the cover 22 may be etched by a vertical etch of the CVD nitride 26 and thermal or CVD oxide 14. Note that the active region is defined by the first masking step and is not dependent upon this second masking step which is a non-critical alignment; note the intentional misalignment illustrated in FIG. 3 and the fact that the ultimate active region protected in FIGS. 4 and 5 is not affected since it is protected by the thermal nitride. If a CVD oxide layer is not present, a vertical etch of the nitride film 26 and some oxide 14 may be performed, after which a 10:1 $H_2O$:HF etch of the bottom oxide 14 may be conducted. The exposed regions of substrate surface 12 are remaining or reduced exposed portions of substrate surface 12 which are also termed future isolation regions 30.

Next, the field isolation regions 32 are formed in the future isolation regions 30 by any of the well known, conventional processes, such as steam oxidation or the like. Depending on the process used, the future isolation regions 30 may be optionally implanted with an impurity to form channel stops under the field oxide regions 32. The results of the isolation oxidation are shown in FIG. 5. Depending on the exact process and conditions, a thin oxide layer 34 may be formed incidentally on top of the active region protective masking cover 22.

Figure 6:
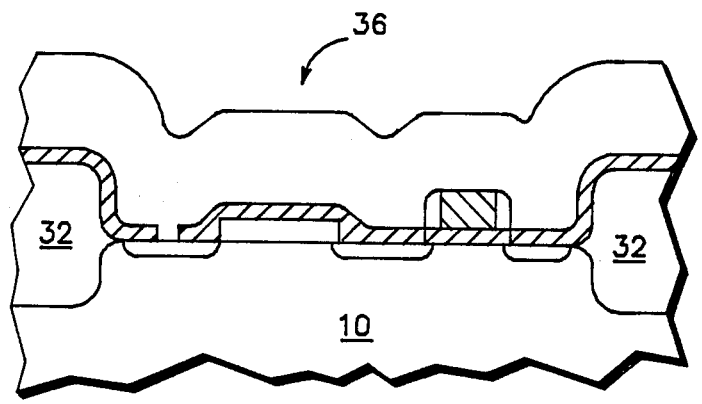

Finally, the active region protective masking covers 22, thermal silicon nitride 20 and protective material pattern 14, and any thin oxide layer 34 that may be present are removed to expose an essentially defect-free semiconductor surface 12 upon which an integrated circuit 36, such as the one suggested in FIG. 6, may be formed. As schematically illustrated and as will be later explained in more detail, the bird's beak is greatly reduced in this procedure.

An alternative to the process illustrated above is to provide nitride on all of the future isolation regions 30 along with the edges of the future active region 16. This broader layer of thermal nitride 20 would then be patterned along with the active region protective masking covers 22 in the steps illustrated in FIGS. 3 and 4, or would be patterned using the anisotropic etch technique to remove the nitride on the field region.

In using this technology for a SILO isolation process, one eliminates the poor gate oxide integrity in subsequently formed MOS transistors, which would be expected when growing a nitride film directly on the single crystal silicon. By providing nitride only on the edges of the active region, resistance to oxidation is provided, but gate oxide integrity will be preserved.

The particular embodiment shown in FIGS. 1 through 6 could be achievable for small geometries, such as submicron geometries, if electron beam or X-ray lithography is used, since it is dependent on the photolithography resolution to define the ultimate isolation dimensions. By way of contrast, the next embodiment to be described can be used to accomplish sub-micron isolation dimensions with currently available optical lithography systems with its present limitations. Of course, if optical lithographic systems are somehow improved to resolve below sub-micron dimensions, they could be used with either embodiment of the invention and the invention should not be limited to use with a particular lithographic system.

Figure 7:
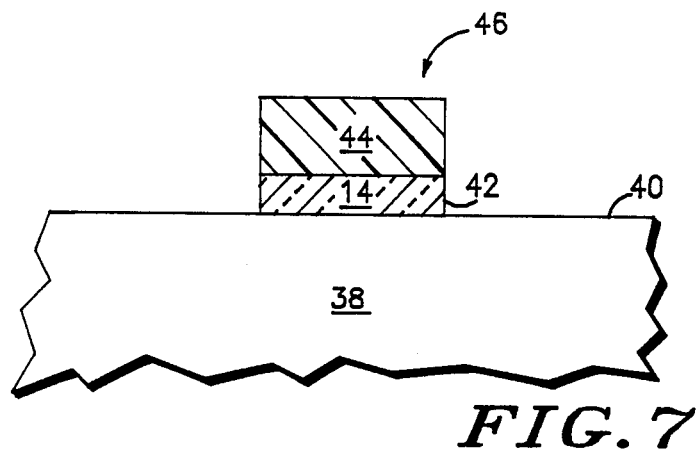
FIGS. 7 through 12 are cross sectional illustrations of the formation of a protected active region for future device formation made in accordance with another embodiment of the isolation process of the present invention.

Shown in FIGS. 7 through 14 is another embodiment of the invention which may be termed Selective Nitridation with Oxide Barrier Isolation (SNOBI). Again, as seen in FIG. 7, a semiconductor substrate 38 is provided which has a surface 40 over which a protective material layer 42 is provided which is in turn covered by at least a first active region protection masking material 44. For the purposes of illustration only, semiconductor substrate 38 may be single crystal silicon, protective material layer 42 may be thermally grown oxide of between 200 and 500 angstroms thick, and first active region protection masking material 44 may be CVD nitride having a thickness between about 500 and 1400 angstroms. The layers of first active region protection masking material 44 and protective material 42 should be patterned to form a plurality of islands 46 with exposed regions of semiconductor surface 40 therebetween.

Figure 8:
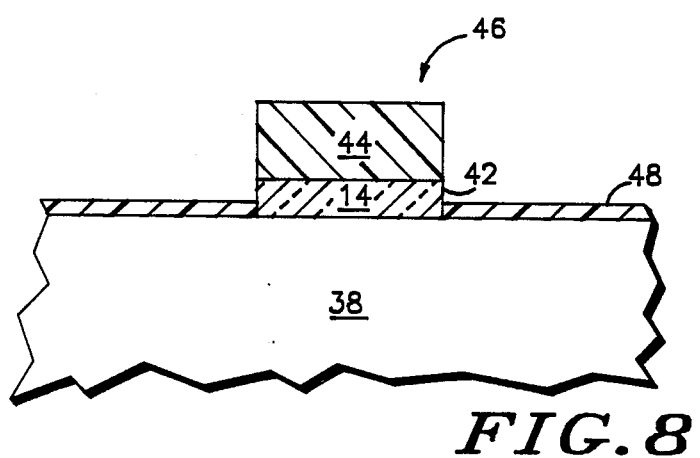
Figure 9:
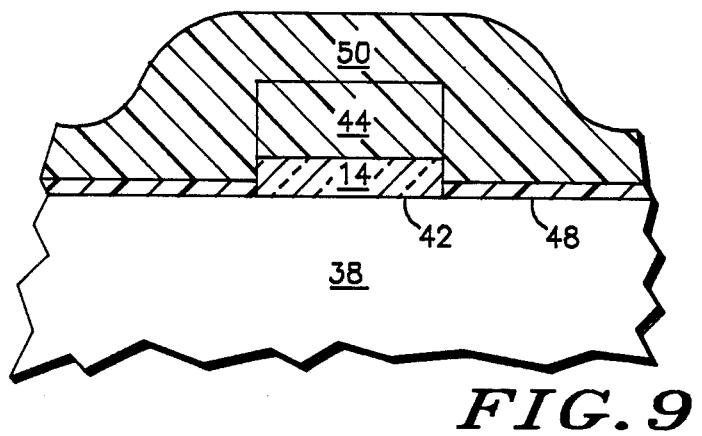

Next, as shown in FIG. 8, a thin layer of thermal silicon nitride 48 is selectively formed in the exposed regions of semiconductor substrate surface 40. This layer 48 may be 50 angstroms thick or thinner. Then as shown in FIG. 9, a second active region protection masking material layer 50 is formed over the islands 46 and the layer 48 of thermal nitride. The second active region protection masking material layer 50 may be CVD nitride or other suitable material that would conform to the contours of the islands 46.

Figure 10:
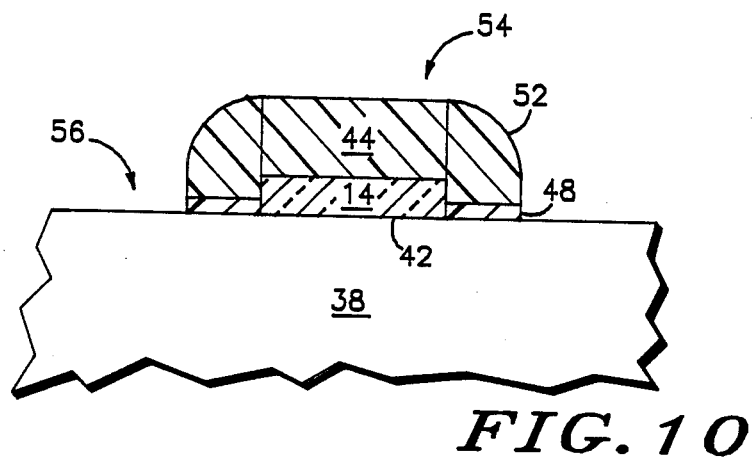

The second active region protection masking material layer 50 is then etched back anisotropically to form a sidewall 52 around each island 46. This same removal or etch step removes the thermal nitride 48 that is not covered by the sidewall 52. The results of this step are seen in FIG. 10 wherein ringed islands 54 have contracted exposed regions 56 of semiconductor substrate surface 40 in between. One may prefer to use a 100 to 200 angstrom poly layer or 500 to 1000 angstrom CVD oxide layer on film 44 as an etch-stop layer for the sidewall etch. This etch may be done in an AME 8110 etcher with a commercial etch giving 20:1 nitride to silicon etch selectivity. It will be appreciated that an advantage of the SNOBI embodiment of the invention is that the thermal nitride portion or ring 48 is self-aligned to the island 46, whereas in the embodiment of FIGS. 1 through 6, the thermal nitride ring 20 must be separately aligned with a separate mask step.

Figure 11:
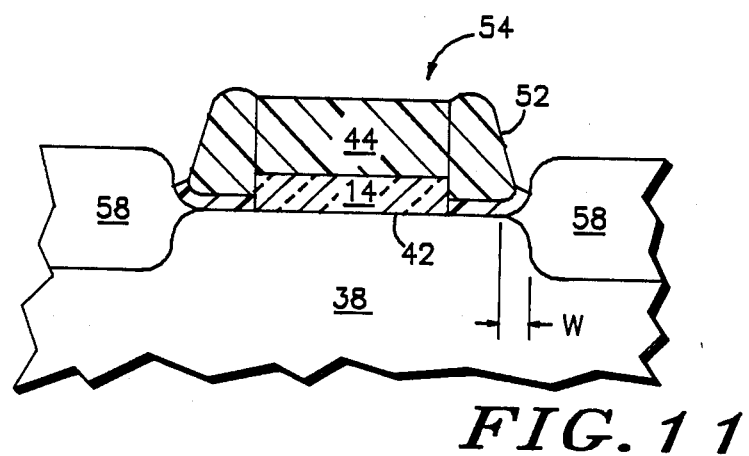

Shown in FIG. 11 is the result after the growth of the field oxide isolation regions 58 according to conventional procedures in the contracted, exposed regions 56 of substrate surface 40. As shown schematically, the bird's beak width, W, is greatly reduced.

Figure 12:
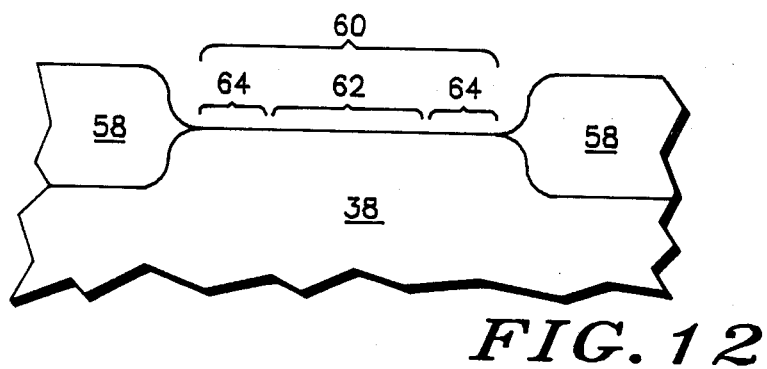

Finally, the first and second active region protection masking layers 44 and 50, including sidewalls 52, ring of thermal silicon nitride 48 and protective material 42 are removed in an etch step to give the structure seen in FIG. 12. Active region 60 for device formation has a region 62 where gate oxide integrity will be good and only a narrow edge 64 where defects may exist, as in the previously described approach.

Again, the potential benefit of this technique is the suppression of the bird's beak structure during field oxidation. It further differs from the conventional SILO technology where the thermal nitride is grown over the entire area. With the present invention process, there will be a much smaller area where nitride is in direct contact with the silicon surface. Further, with this process, sub-micron isolation structures may be formed by controlling the thickness of the sidewall 52. This method may be especially crucial if photographic resolution is a limiting factor of the overall process.

Figure 14:
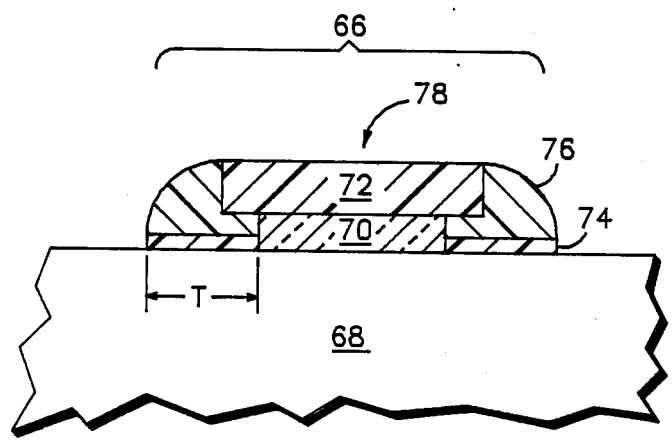
FIG. 14 is a cross sectional illustration of a masking structure in accordance with another embodiment of the invention prior to the growth of field oxide regions.

Shown in FIG. 14 is an alternate embodiment of the SNOBI isolation structure equivalent to FIG. 10 in the immediately preceding discussion. Again, future active region 66 on substrate surface 68 is covered by protective material layer 70 which is in turn covered by first active region protection masking material 72. The difference between the structure of FIG. 14 and FIG. 10 is that the protective material layer 70 is over-etched and masking material 72 is undercut by the etch that forms the islands. This permits sidewalls 76, which should be made from a truly conformal material to fill the undercut, to have a unique L-shaped configuration to help strengthen the island against oxide encroachment. This island is surrounded by thermal nitride ring 74 which is covered by sidewalls 76 made of second active region protection masking material layer to give ringed island 78.

EXAMPLE 1

Figure 13:
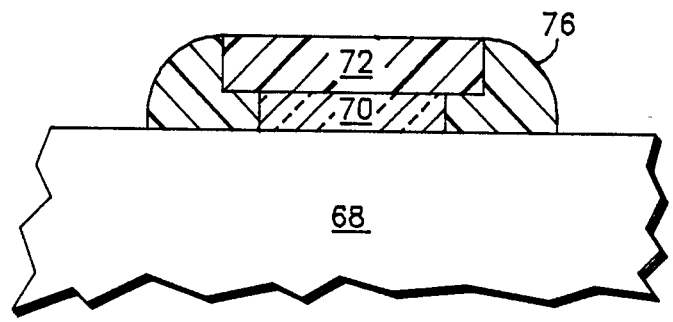
FIG. 13 is a cross sectional illustration of a comparative masking structure similar to one used in a prior art isolation formation process.

A structure like that shown in FIG. 14 was used in an isolation process. Protective material layer 70 was thermally grown oxide 500 angstroms thick. First active region protection masking material 72 was CVD nitride 35 angstroms thick. This double layer was patterned and the oxide undercut was 0.5 microns from each side. The thermal nitride ring was 40 angstroms thick and the second active region protection masking material layer was conformal CVD nitride 500 angstroms thick, which made the sidewall 76 thickness, T, also 500 angstroms. This structure permitted a bird's beak field oxide encroachment of only 0.07 microns in contrast to the bird's beak encroachment of 0.36 microns obtained with the structure of FIG. 13 which was built identically to that of FIG. 14 except that thermal nitride ring 74 was absent, as shown. The structure of FIG. 13 is somewhat similar to, but not identical to, the structure of U.S. Pat. No. 4,583,281. The FIG. 13 structure is, in fact, closer to the structure of the present invention than the structure of U.S. Pat. No. 4,583,281. For further comparison, a typical modified LOCOS structure was used as a control (not illustrated in the Figures), and was also built wherein CVD nitride was placed on top of oxide with the above dimensions, but no thermal nitride or sidewalls were used, and the structure had essentially vertical sides. The bird's beak encroachment for this structure was 0.6 microns. All encroachment were measured before etch back; the bird's beak for all techniques would be expected to be less after the etch back of the masking structure.

From the results of the experiment reported above, it may be seen that bird's beak encroachment may be greatly reduced; by more than one-fifth of that of a closely comparative structure. The unique structure of thermal nitride ring, sidewalls and optional undercut greatly help preserve semiconductor substrate space, reduce the thickness of the second nitride layer (50) as well as preserve gate oxide integrity with the help of the central protective material layer. Sidewall thickness is an important parameter, and as noted may be chosen by the process engineer; but a suggested thickness range for T might be 300 to 1000 angstroms. A suggested undercut range of the protective material layer might be 0.15 to 0.30 microns.

It may also be noted from this experiment that very fine features can be defined with the sidewall spacer embodiment of this invention using current optical lithographic systems having micron-scale resolution limitations.

We claim:

1. A protected active region formed on a surface of a semiconductor substrate, for future device formation, surrounded by an isolation region, made by the process comprising the steps of:
    forming a protective material over the protected region of the surface of the semiconductor substrate;
    forming a thermal silicon nitride rings in the semiconductor substrate immediately surrounding the protected region;
    forming a masking cover over the protected region and the surrounding silicon nitride ring;
    forming an isolation region in the semiconductor substrate surrounding the ring; and
    removing the masking cover, the ring and the protective material to expose the protected region.

2. The protected active region of claim 1 wherein the semiconductor substrate is monocrystalline silicon.

3. The protected active region of claim 1 wherein the layer of protective material is silicon dioxide.

4. The protected active region of claim 1 wherein the masking cover comprises a layer selected from the group consisting of silicon oxide, silicon nitride and combinations of silicon oxide and silicon nitride.

5. A protected active region formed on a surface of a semiconductor substrate, for future device formation surrounded by an isolation region, made by the process comprising the steps of:
    forming a protective material over the protected region of the surface of the semiconductor substrate;
    selectively forming a layer of thermal silicon nitride in the exposed portions of the semiconductor substrate immediately surrounding the protected region;
    forming at least one masking cover over the protected region and the surrounding thermal silicon nitride layer;
    patterning the masking cover and the thermal silicon nitride layer to reveal portions of the semiconductor substrate;
    forming an isolation region in the semiconductor substrate revealed in the previous step; and
    removing the masking cover, thermal silicon nitride layer and protective material to expose the protected region.

6. The protected active region of claim 5 wherein the semiconductor substrate is monocrystalline silicon.

7. The protected active region of claim 5 wherein the protective material is silicon dioxide.

8. The protected active region of claim 5 wherein the masking cover is selected from the group consisting of silicon dioxide, silicon nitride and combinations of silicon dioxide and silicon nitride.

9. A protected active region formed on a surface of a semiconductor substrate, for future device formation, surrounded by an isolation region, made by the process comprising the steps of:
    forming a uniform layer of protective material over the surface of the semiconductor substrate;
    forming a uniform layer of first masking material over the uniform layer of protective material;
    patterning the layers of first masking material and the layer of protective material to form an island surrounded by an exposed semiconductor substrate surface;
    selectively forming a layer of thermal silicon nitride on the exposed regions of semiconductor substrate surface;
    forming a uniform layer of second masking material over the island and the layer of thermal silicon nitride;
    patterning the uniform layer of second masking material and the layer of thermal silicon nitride to form a sidewall of second masking material around the island, the sidewall having a ring of thermal silicon nitride beneath to form a ringed island surrounded by a contracted exposed region of semiconductor substrate surface;
    forming an isolation region in the contracted exposed regions of semiconductor substrate surface; and
    removing the first and second masking layers, ring of thermal silicon nitride and protective material to expose the protected region.

10. The protected active region of claim 9 wherein the semiconductor substrate is monocrystalline silicon.

11. The protected active region of claim 9 wherein the protective material is silicon dioxide.

12. The protected active regions of claim 9 wherein both the first and the second masking material layers are selected from the group consisting of silicon oxide, silicon nitride and combinations of silicon oxide and silicon nitride.

13. The protected active region of claim 9 wherein the uniform layer of second masking material that forms the sidewall spacers is chemical vapor deposited (CVD) nitride.

14. The protected active region claim 9 wherein the protective material layer is over-etched and the first masking material layer is undercut, and the second masking material fills the undercut.

15. A protected active region formed on a surface of a monocrystalline silicon substrate, for future device formation, surrounded by an isolation region, made by the process comprising the steps of:
    forming a uniform layer of silicon dioxide over the surface of the silicon substrate;
    forming a first uniform layer of silicon nitride over the uniform layer of silicon dioxide;
    patterning the layers of silicon nitride and the layer of silicon dioxide to form an island surrounded by an exposed region of silicon substrate surface;
    selectively forming a layer of thermal silicon nitride on the exposed regions of silicon substrate surface;
    forming a second uniform layer of silicon nitride over the island and the layer of thermal silicon nitride;
    patterning the second uniform layer of silicon nitride and the layer of thermal silicon nitride to form a sidewall of silicon nitride around the island, the sidewall having a ring of thermal silicon nitride beneath to form a ringed island surrounded by a contracted exposed region of silicon substrate surface;
    forming a silicon dioxide isolation region in the contracted exposed region of silicon substrate surface; and
    removing the first and second layers of silicon nitride, ring of thermal silicon nitride and protective layer of silicon dioxide to expose the protected region.

* * * * *